United States Patent
Ogo et al.

(10) Patent No.: US 9,472,433 B2
(45) Date of Patent: Oct. 18, 2016

(54) MOUNTING PORT AND MOUNTING PORT OPENING/CLOSING METHOD

(71) Applicant: Murata Machinery, Ltd., Kyoto-shi, Kyoto (JP)

(72) Inventors: Haruki Ogo, Inuyama (JP); Hiroyuki Shimada, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 14/425,758

(22) PCT Filed: Jul. 23, 2013

(86) PCT No.: PCT/JP2013/069914
§ 371 (c)(1),
(2) Date: Mar. 4, 2015

(87) PCT Pub. No.: WO2014/038301
PCT Pub. Date: Mar. 13, 2014

(65) Prior Publication Data
US 2015/0228519 A1 Aug. 13, 2015

(30) Foreign Application Priority Data

Sep. 5, 2012 (JP) ................. 2012-194939

(51) Int. Cl.
*H01L 21/677* (2006.01)
*H01L 21/67* (2006.01)

(52) U.S. Cl.
CPC ... *H01L 21/67772* (2013.01); *H01L 21/67126* (2013.01); *H01L 21/67766* (2013.01); *H01L 21/67769* (2013.01); *H01L 21/67775* (2013.01)

(58) Field of Classification Search
CPC .. H01L 21/677; H01L 21/67775; B65G 1/00
See application file for complete search history.

(56) References Cited

U.S. PATENT DOCUMENTS

| | | | | |
|---|---|---|---|---|
| 6,190,103 B1* | 2/2001 | Erez | ............... | H01L 21/67201 294/106 |
| 6,578,893 B2* | 6/2003 | Soucy | ............... | H01L 21/68707 294/99.1 |
| 6,591,960 B2* | 7/2003 | Babbs | ............... | B25J 15/0206 198/346.2 |
| 7,140,655 B2* | 11/2006 | Kesil | ............... | B25J 9/1633 294/104 |
| 7,789,443 B2* | 9/2010 | Gillespie | ............... | B25J 15/0052 294/106 |
| 2003/0175106 A1* | 9/2003 | Urban | ............... | H01L 21/68707 414/729 |

FOREIGN PATENT DOCUMENTS

| | | |
|---|---|---|
| JP | 49-073163 U | 6/1974 |
| JP | 03-023513 Y2 | 5/1991 |
| JP | 2004-359362 A | 12/2004 |
| JP | 2007-113287 A | 5/2007 |
| JP | 2008-254897 A | 10/2008 |
| JP | 4185818 B2 | 11/2008 |

OTHER PUBLICATIONS

Official Communication issued in International Patent Application No. PCT/JP2013/069914, mailed on Oct. 1, 2013.
* cited by examiner

*Primary Examiner* — Jonathan Snelting
(74) *Attorney, Agent, or Firm* — Keating & Bennett, LLP

(57) ABSTRACT

A mounting port that allows an article to be relayed between a worker and a conveying apparatus or a processing device in a clean room includes a shutter that raises little or no dust and has a simple opening and closing mechanism. The mounting port includes an article mounting stand, an apparatus-side opening that allows a conveying apparatus or a processing device to pass an article to and from the mounting stand, a passageway-side opening that faces a worker passageway, shutters that are provided at positions to open and close the apparatus-side opening and includes arc-shaped plates or plates, and a swing mechanism that swings the shutters between a state in which the apparatus-side opening is opened and a state in which the apparatus-side opening is closed.

8 Claims, 5 Drawing Sheets

F I G. 1
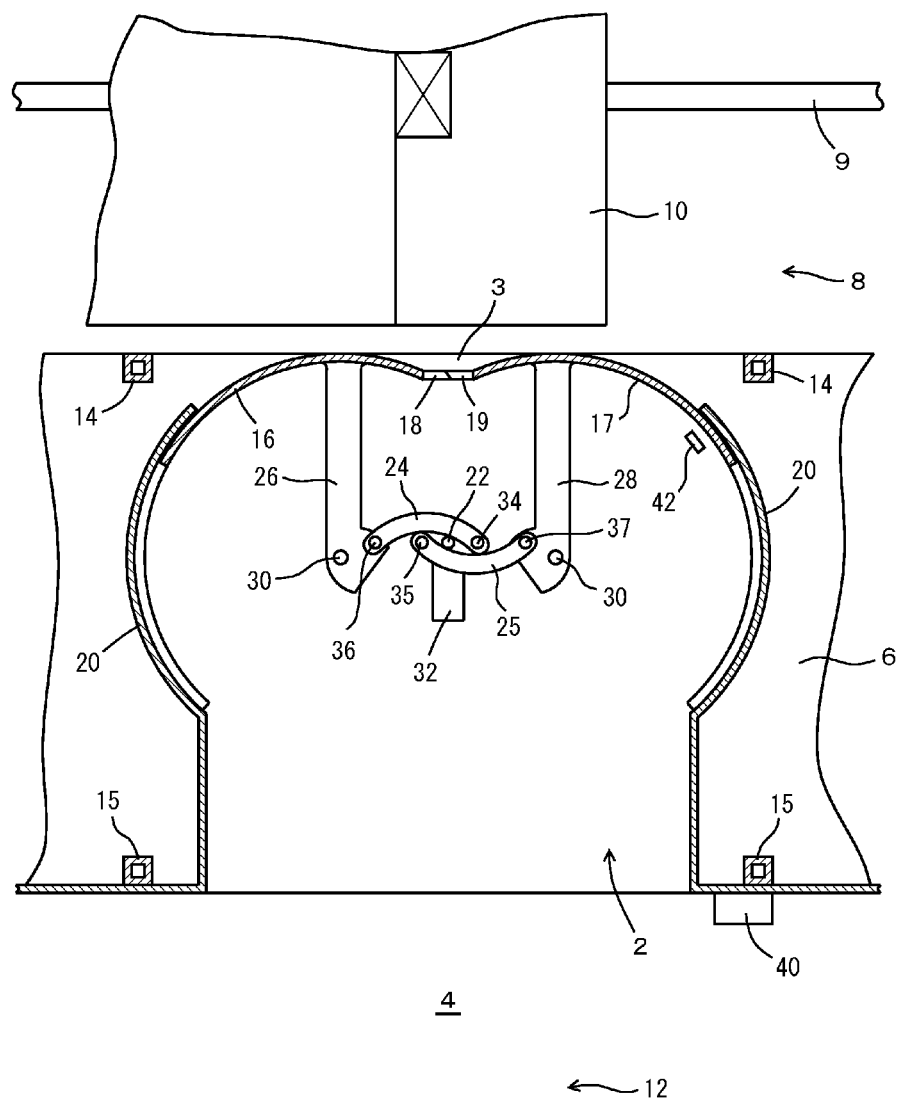

F I G. 2
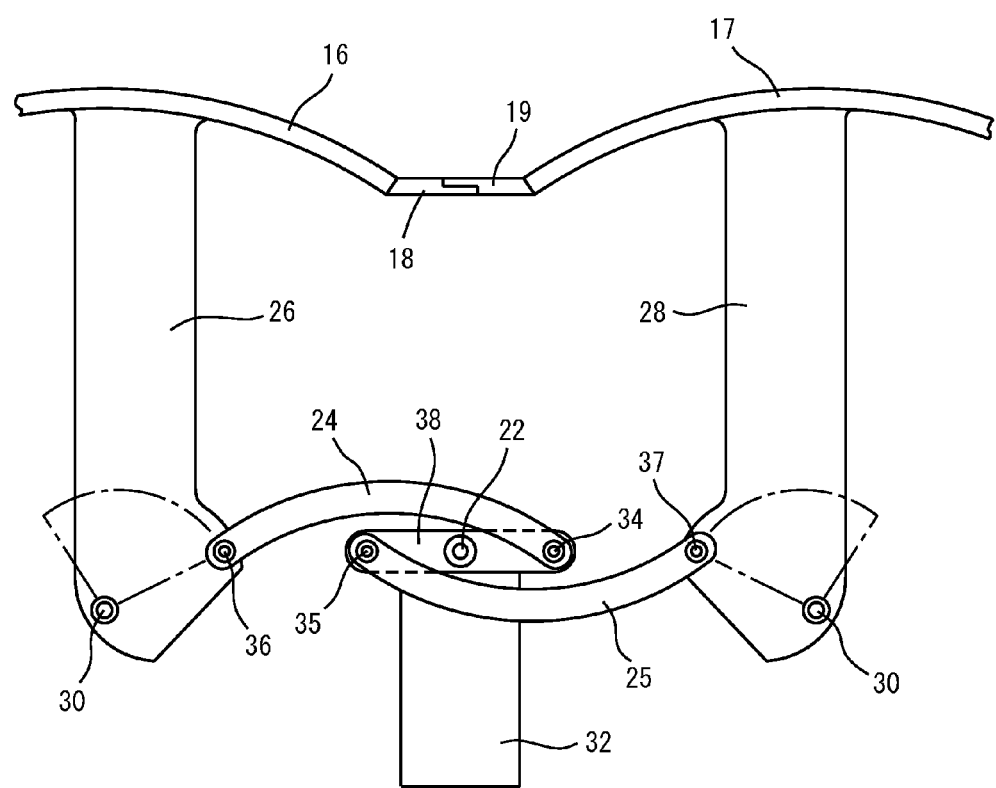

F I G. 5
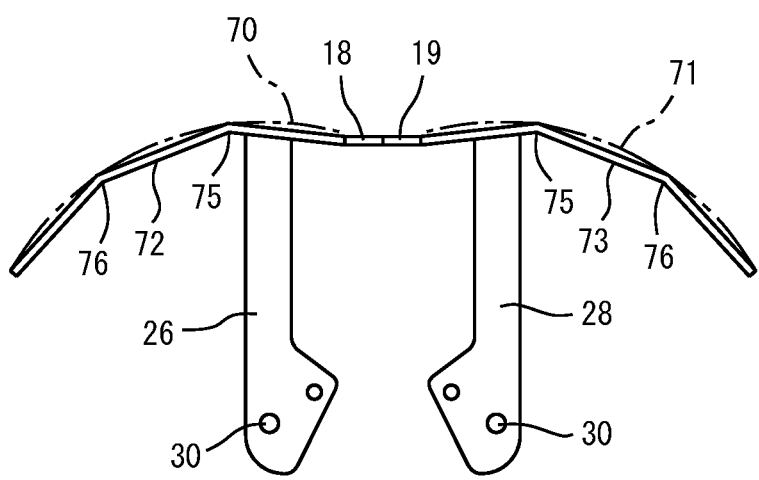

MOUNTING PORT AND MOUNTING PORT OPENING/CLOSING METHOD

BACKGROUND OF THE INVENTION

1. Field of the Invention

The present invention relates to a mounting port configured to mount articles, and a method for opening and closing the mounting port.

2. Description of the Related Art

A stocker is an apparatus that stores articles such as semiconductor wafers in a clean room, and internally includes a conveying apparatus and shelves. A worker delivers and receives articles via a mounting port. In order to prevent interference between the worker and the conveying apparatus, the opening on the conveying apparatus side of the mounting port is opened and closed by a shutter. However, when the shutter is slid in the horizontal direction, it enters an adjacent shelf's region, thus creating a dead space.

To address this problem, JP 4185818B proposes the opening and closing of the opening of the mounting port by guiding a sheet-like shutter with rollers. Guiding the sheet with rollers tends to raise dust, and since the sheet-like shutter bends easily, it requires space and has insufficient durability. A linear motion mechanism is needed to guide the leading edge of the shutter, thus raising the cost and raising a large amount of dust.

SUMMARY OF THE INVENTION

Preferred embodiments of the present invention provide a mounting port that includes a shutter that raises little or no dust and includes a simple opening and closing mechanism, and a method of opening and closing the mounting port.

According to a preferred embodiment of the present invention, a mounting port via which an article is relayed between a worker and a conveying apparatus or a processing device in a clean room includes an article mounting stand; an apparatus-side opening via which a conveying apparatus or a processing device transfers an article to and from the mounting stand; a passageway-side opening that faces a worker passageway; a shutter that is provided at a position to open and close the apparatus-side opening and includes an arc-shaped plate or a plate bent in an arc; and a swing mechanism configured to swing the shutter about a predetermined axis between a state in which the apparatus-side opening is opened and a state in which the apparatus-side opening is closed.

According to the present preferred embodiment of the present invention, the opening is opened and closed by the shutter, which includes an arc-shaped plate or a plate bent in an arc, swinging about the predetermined axis. Since the shutter is swung, a sliding portion and a linear motion mechanism are not needed, little or no dust is raised, and the cost is low. Furthermore, since the shutter is plate-shaped, it has a higher strength than a sheet-like shutter, and does not bend easily. Note that the shutter may include a combination of multiple plates.

Preferably, the shutter includes a pair of shutters, the predetermined axis includes a pair of axes, one axis corresponding to one shutter, and another axis corresponding to another shutter, the swing mechanism includes a driving axis provided at a position symmetrical with respect to the pair of shutters, a motor that rotates the driving axis, the pair of axes, a link mechanism that swings the pair of axes the same angle in opposite directions by rotation of the driving axis, and a pair of joining members that are attached to the pair of shutters and swing the pair of shutters about the pair of axes, the pair of axes are provided at positions that are separated from each other and symmetrical with respect to the driving axis, and the link mechanism is configured such that force applied to the joining members is not transmitted to the driving axis when the pair of shutters are closed.

Providing the pair of shutters makes it possible to reduce the amount of space needed to store the shutters in the closed state. Also, the pair of joining members are capable of being swung along the same angle in opposite directions by the driving axis provided at a position symmetrical with respect to the pair of shutters, the motor that rotates the driving axis, the pair of axes provided at positions that are separated from each other and symmetrical with respect to the driving axis, and the link mechanism that swings the pair of axes the same angle in opposite directions by rotation of the driving axis. When the pair of shutters are closed, a force applied to the joining members is not transmitted to the driving axis, and therefore the motor does not need to be provided with a brake.

More preferably, the pair of shutters are a pair of left and right shutters, and the driving axis and the axes are vertical axes. According to this configuration, the shutters are stored in empty space to the left and right of the mounting port when in the open state.

Preferably, the link mechanism includes a crank that is attached to the driving axis in a central portion in a lengthwise direction, and a pair of connection rods, ends of the pair of connection rods on one side are respectively rotatably attached to two ends of the crank, and ends on another side are respectively rotatably attached to the pair of joining members at positions separated from the pair of axes, and the ends of the pair of connection rod on the one side are at respective dead center positions when the pair of shutters are closed. According to this configuration, the pair of shutters are reliably opened and closed by four-bar linkage, and the shutters do not open even if force is inadvertently applied.

Particularly preferably, the swing mechanism is provided below the mounting port, and a partition that separates the swing mechanism and the mounting stand is provided. According to this configuration, dust raised by the swing mechanism is blocked by the partition and prevented from reaching articles.

Preferably, the partition is shaped as a flat plate, and a groove that accommodates a side surface of the plate is provided in each of the pair of left and right shutters. According to this configuration, it is difficult for a finger or the like to become pinched in the gap between the side surface of the partition and the shutters.

Most preferably, above the mounting port, a pair of upper joining members that swing coaxially with the pair of axes are provided separately from the pair of joining members provided below the mounting port, and are respectively attached to upper portions of the pair of left and right shutters, and the pair of joining members provided below the mounting port and the pair of upper joining members support the pair of left and right shutters in a manner of non-contact with other portions of the mounting port. According to this configuration, the shutters open and close without coming into contact with surrounding members, thus making it possible to reduce the raising of dust to a very small amount.

Also, another preferred embodiment of the present invention provides a method for opening and closing a mounting port via which an article is relayed between a worker and a conveying apparatus or a processing device in a clean room, the mounting port including an article mounting stand; an apparatus-side opening configured to allow a conveying apparatus or a processing device to pass an article to and from the mounting stand; a passageway-side opening that faces a worker passageway; a shutter that is provided at a position to open and close the apparatus-side opening and includes an arc-shaped plate or a plate bent in an arc; and a swing mechanism configured to swing the shutter about a predetermined axis between a state in which the apparatus-side opening is opened and a state in which the apparatus-side opening is closed, the apparatus-side opening being opened and closed by swinging the shutter about the predetermined axis.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a partial cutout plan view of a mounting port according to a preferred embodiment of the present invention, in a state in which an upper plate has been removed.

FIG. 2 is a plan view showing a link mechanism for shutter opening and closing, in a state in which the shutters are closed.

FIG. 5 is a plan view showing a variation of the shutters.

DETAILED DESCRIPTION OF THE PREFERRED EMBODIMENTS

Figure 3:
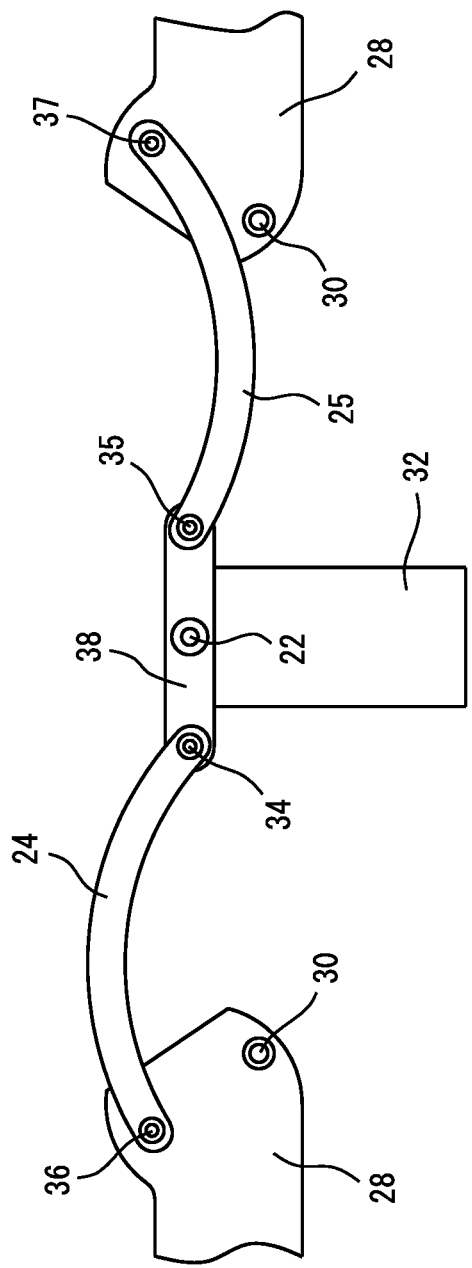
FIG. 3 is a plan view showing the link mechanism for shutter opening and closing, in a state in which the shutters are open.

The following describes various preferred embodiments of the present invention. The scope of the present invention is based on the recitation of the claims, and is intended to be determined in accordance with the understanding of a person skilled in the art with reference to the recitation of this description and well-known techniques in the field of the present invention.

FIGS. 1 to 4 show a mounting port 2 according to a preferred embodiment of the present invention. The mounting port 2 includes an apparatus-side opening 3 (hereinafter, simply "opening 3"). The mounting port 2 is preferably used to convey semiconductor wafers, reticles, flat panel display substrates, or the like in a clean room, and is provided in a stocker 4 that stores containers containing these articles, for example. Note that the containers will be simply called articles in the following description. 6 indicates a shelf that includes the mounting port 2 provided on a portion thereof. 8 indicates a conveying space in which a conveying apparatus 10 such as a stacker crane travels along a rail 9 to convey articles within the stocker 4. The mounting port 2 is a port used when articles are delivered to and received from the stocker 4. Articles are transferred to the mounting port 2 through an opening on a passageway 12 side either manually or by an automated guided vehicle or the like, and then conveyed to the front of the shelf 6 by the conveying apparatus 10. Conversely, articles are also transferred from the conveying apparatus 10 to the mounting port 2, and then transferred to the passageway 12 side either manually or by an automated guided vehicle or the like. 14 and 15 indicate vertical supports of the stocker 4.

In order to avoid interference between the conveying apparatus 10 and people or the like, a pair of left and right plate-shaped shutters 16 and 17 are provided at the boundary between the mounting port 2 and the conveying space 8 of the conveying apparatus 10. The shutters 16 and 17 each include a single metal plate or the like, are arc-shaped in a plan view, cannot be folded, and do not include a door roller or the like. Preferably, elastic portions 18 and 19 are provided at the portions where the shutters 16 and 17 come into contact with each other, so as to prevent the raising of dust and the like due to the contact. The shutters 16 and 17 each swing in a predetermined range with an axis 30 defining and serving as a vertical axis, and the left and right side surfaces of the mounting port 2 are covered by covers 20. When the shutters 16 and 17 open, they move inward of the covers 20, and the shutters 16 and 17 and the covers 20 do not come into contact at that time. The shutters 16 and 17 swing between the state in which the entrance to the mounting port 2 is open and the state in which the entrance is closed as in FIG. 1.

FIGS. 2 and 3 show a mechanism configured to open and close the shutters 16 and 17. Note that the upper plate has been removed in FIGS. 1 to 3. 22 indicates a driving axis that is located at a position symmetrical with respect to the shutters 16 and 17 and drives a crank 38. 24 and 25 indicate connection rods that swing arms 26 and 28, which are attached to the shutters 16 and 17, at an angle of 90° or 90°, for example, about the pair of axes 30, 30 arranged at positions symmetrical with respect to the driving axis 22. The driving axis 22 is rotated in a range of 180° or approximately 180°, for example, by a motor 32, and the motor 32 does not include a brake. Also, the shutters 16 and 17 are each swingably supported from above the mounting port 2 as well, by an arm 62 and axes 64 (FIG. 4) that is coaxial with the corresponding axes 30, 30, and thus are suspended above the other elements of the mounting port 2. Axes 34 and 35 join the crank 38 and the connection rods 24 and 25, and axes 36 and 37 join the connection rods 24 and 25 and arms 26 and 28. The dashed-dotted lines in FIG. 2 indicate the swinging range (for example, 90° or approximately) 90° of the axes 36 and 37. Furthermore, the axes 22, 30, and 34 to 37 include bearings or the like.

In the state in which the shutters 16 and 17 are closed as shown in FIG. 2, and also in the state in which they are open as shown in FIG. 3, the axes 34 and 35 are at dead center, and although the shutters 16 and 17 are capable of being opened and closed by the motor 32, it is difficult for the crank 38 to be swung by the shutters 16 and 17. For this reason, the shutters 16 and 17 do not open or close inadvertently, and there is no need to provide the motor 32 with a brake. Note that since it is important for the shutters 16 and 17 to not open inadvertently, it is sufficient that the axes 34 and 35 are at dead center when the shutters 16 and 17 are in the closed state as shown in FIG. 2, and these axes are not necessarily required to be at dead center in the state shown in FIG. 3.

In FIG. 1, 40 indicates an operation panel that is used for operation of the stocker 4 or communication with the stocker 4 by the worker or an automated guided vehicle. 42 indicates a magnetic sensor that detects the shutter 17, which includes a metal plate, for example, to confirm that the shutters 16 and 17 are closed. Note that if the shutters 16 and 17 include a plastic plate, a metal plate or metal plating may be provided at the position to be detected by the magnetic sensor 42, or the shutters 16 and 17 may be detected by a reflective light projecting/receiving sensor instead of the magnetic sensor 42. Also, a ground controller (not shown) of the stocker 4 controls the opening and closing of the shutters 16 and 17. The shutters 16 and 17 are normally closed, and when it is not confirmed by the magnetic sensor 42 that the shutters 16 and 17 are closed, the entrance of the conveying apparatus 10 into the region facing the mounting port 2 is prohibited. When the conveying apparatus 10 arrives at the mounting port 2, the worker's attention is called using the operation panel 40 or the like, the shutters 16 and 17 are opened and closed, and articles are transferred.

Figure 4:
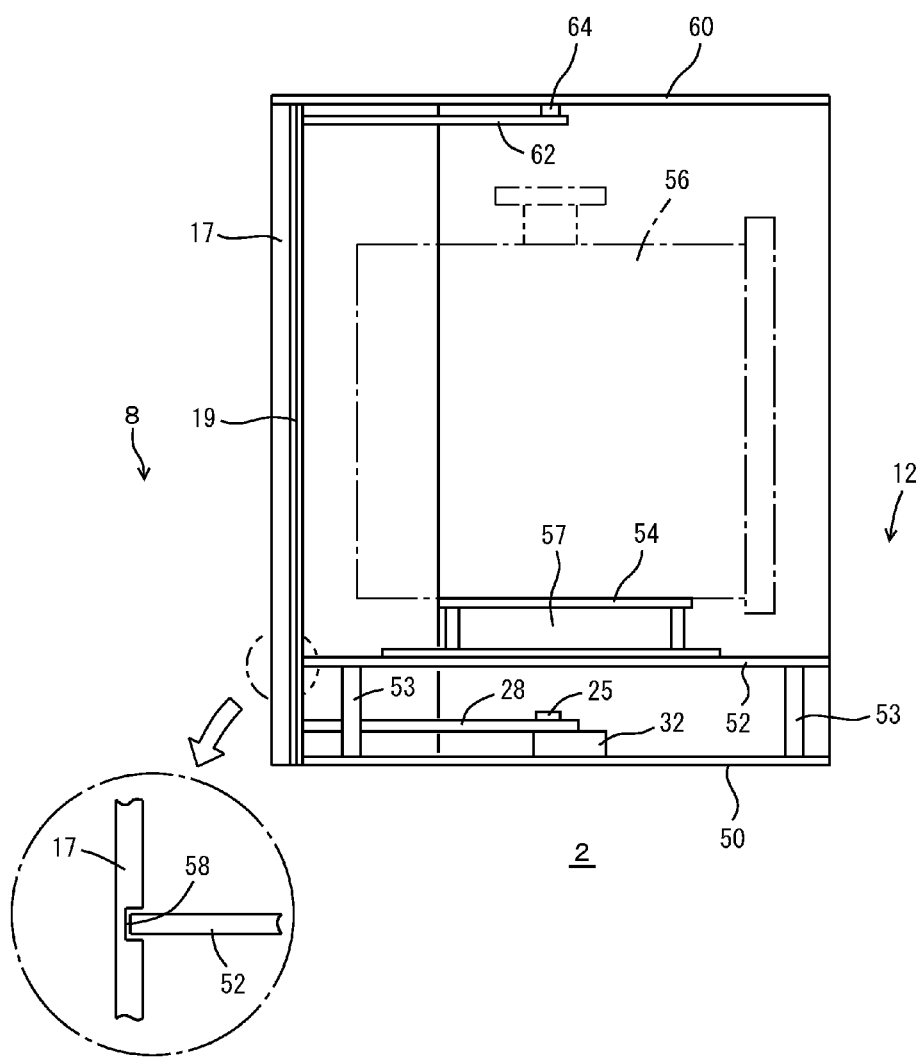
FIG. 4 is a side view of a relevant portion of the mounting port according to a preferred embodiment of the present invention, in a state in which the shutter on one side has been removed.

FIG. 4 shows the mounting port 2 in a view from the side, in the state in which the shutter 16 on one side has been removed. 50 indicates a lower plate that is the base portion of the mounting port 2, and 52 indicates an upper plate that is fixed to the lower plate 50 by a vertical support 53. A mounting stand 54 is provided on the upper plate 52, and an article 56 such as an FOUP is mounted thereon. A transfer space 57 is provided between the bottom surface of the mounting stand 54 and the upper plate 52 to enable the movement of a scalar arm, a slide fork, or the like of the conveying apparatus 10 or the like. It is preferable to prevent fingers from being pinched in the gap between the upper plate 52 and the shutters 16 and 17. To achieve this, a groove 58 is provided in the shutters 16 and 17, and the side surface of the leading edge of the upper plate 52 is accommodated in the grooves 58 as shown in the lower left of FIG. 4. 60 indicates a top plate of the mounting port 2 that is provided with the arms 62 at positions overlapping the arms 26 and 28 in a plan view, and the shutters 16 and 17 are supported thereto by axes 64 that are coaxial with the axes 30, 30. Note that the arms 62 and the axes 64 are provided as pairs of left and right members. The shutters 16 and 17 are supported by the arms 26, 28, 62, and the like, and are suspended above the mounting port 2 in other portions.

The following describes operations in this preferred embodiment. The shutters 16 and 17 are normally closed, and due to operation of the operation panel 40 or communication with the operation panel 40 by a worker or an automated guided vehicle, an article 56 is transferred to or from the mounting stand 54. After the conveying apparatus 10 transfers the article 56 to or from the mounting stand 54, if it is not confirmed by the magnetic sensor 42 that the shutters 16 and 17 are closed, the conveying apparatus 10 is prevented from entering the region adjacent to the mounting port 2. A worker or an automated guided vehicle checks the transfer of an article on the operation panel 40, and the opening of the shutters 16 and 17 is prohibited until the transfer is completed. When the conveying apparatus 10 stops at a position adjacent to the mounting port, the shutters 16 and 17 are opened and closed, and the article 56 is transferred. Here, when the conveying apparatus 10 accesses the mounting port 2, the worker's attention is called using the operation panel 40 or the like, and access by the automated guided vehicle is prohibited.

The mechanism configured to open and close the shutters 16 and 17 is summarized as follows.

The opening 3 of the mounting port 2 is opened and closed by the pair of left and right plate-shaped shutters 16 and 17 swinging about the axes 30, 30.

The shutters 16 and 17 are hidden inward of the cover 20 when opened.

A driving axis 22 is located at a position that is bilaterally symmetric as viewed from the pair of shutters 16 and 17, and is rotated by the motor 32 that does not include a brake.

A link mechanism that includes the crank 38, the connection rods 24 and 25, and the like converts the rotation of the driving axis 22 into swinging of the arms 26 and 28 about the axes 30, 30 in a bilaterally symmetrical manner.

With respect to cleanliness in the mounting port 2, the mounting port 2 is preferably configured as follows.

The shutters 16 and 17 are suspended above their surroundings and do not have sliding portions, and a linear motion mechanism configured to move the shutters 16 and 17 is not provided. Also, there is no mechanism by which the shutters 16 and 17 are bended, folded, or the like. Accordingly, very little or no dust is raised in the opening and closing of the shutters 16 and 17.

The driving axis 22 and the like are arranged below the upper plate 52, and are separated from the space that houses the articles 56.

Safety is ensured as follows. The conveying apparatus 10 does not enter the region adjacent to the mounting port 2 if the magnetic sensor 42 has not confirmed that the shutters 16 and 17 are closed. The side surface of the upper plate 52 is accommodated in the grooves 58 in the shutters 16 and 17, thus making it difficult for a finger or the like to become pinched in the gap between the shutters 16 and 17 and the upper plate 52. The worker or an automated guided vehicle checks the transfer of articles on the operation panel 40, and the opening of the shutters 16 and 17 is prohibited until the transfer has ended. When the conveying apparatus 10 accesses the mounting port 2, the worker's attention is called using the operation panel 40 or the like, and access by the automated guided vehicle is prohibited.

The mounting port 2 preferably further includes the following features.

The shutters 16 and 17 are stored on the left and right sides, and therefore the shutters 16 and 17 are capable of being stored in the spaces on the sides of the mounting port 2.

The shutters 16 and 17 are not bent or the like, and therefore durability is high. For example, a sheet-shaped shutter has low strength.

Although the pair of shutters 16 and 17 that open to the left and right are described in the present preferred embodiment, this is not limiting. For example, a single shutter having the axis 30, with the center of the axis 30 being horizontal, may be swung about a horizontal central axis. However, in this case, the space configured to store the shutter increases in size. Also, a pair of upper and lower shutters, rather than a pair of left and right shutters, may be swung in a mutually linked manner. However, in this case as well, a large amount of dead space is needed above and below the mounting port 2. Note that the mounting port 2 may be the load port of a processing device instead of the stocker 4. Furthermore, the mounting port 2 need only be accessible by a worker, and does not need to be accessible by an automated guided vehicle.

Since it is difficult to bend the shutters 16 and 17 into a perfect arc, FIG. 5 shows a simpler example. 72 and 73 indicate shutters that replace the shutters 16 and 17 and are bent at bending portions 75 and 76 so as to follow virtual arcs 70 and 71.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A mounting port via which an article is relayed between a worker and a conveying apparatus or a processing device in a clean room, the mounting port comprising:

an article mounting stand;

an apparatus-side opening via which the conveying apparatus or the processing device transfers the article to and from the mounting stand;

a passageway-side opening that faces a worker passageway;

a pair of shutters provided at positions to open and close the apparatus-side opening and including arc-shaped plates or plates bent in an arc; and a swing mechanism configured to swing the pair of shutters between a state in which the apparatus-side opening is opened and a state in which the apparatus-side opening is closed; wherein the swing mechanism includes a driving axis provided at a position symmetrical with respect to the pair of shutters, a pair of shutter axes, a link mechanism configured to swing the pair of shutter axes along a same angle in opposite directions by rotation of the driving axis, and a pair of joining members that are attached to the pair of shutters and the pair of shutter axes and swing the pair of shutters about the pair of shutter axes; and the pair of shutter axes are provided at positions that are separated from each other and symmetrical with respect to the driving axis.

2. The mounting port according to claim 1, further comprising a motor configured to rotate the driving axis, wherein the link mechanism is configured such that a force applied to the joining members is not transmitted to the driving axis when the pair of shutters are closed.

3. The mounting port according to claim 1, wherein the pair of shutters include a pair of left and right shutters, and the driving axis and the pair of shutter axes are vertical axes.

4. The mounting port according to claim 3, wherein the link mechanism includes a crank that is attached to the driving axis in a central portion in a lengthwise direction, and a pair of connection rods;

ends of the pair of connection rods on one side are respectively rotatably attached to two ends of the crank, and ends on another side of the connection rods are respectively rotatably attached to the pair of joining members at positions separated from the pair of shutter axes; and the ends of the pair of connection rods on the one side are at respective dead center positions when the pair of shutters are closed.

5. The mounting port according to claim 4, wherein the swing mechanism is provided in a lower portion of the mounting port, and a partition is arranged to separate the swing mechanism and the mounting stand.

6. The mounting port according to claim 5, wherein the partition includes a flat plate, and a groove that accommodates a side surface of the flat plate is provided in each of the pair of left and right shutters.

7. The mounting port according to claim 6, wherein in an upper portion of the mounting port, a pair of upper joining members configured to swing coaxially with the pair of shutter axes are provided separately from the pair of joining members provided in the lower portion of the mounting port, and are respectively attached to upper portions of the pair of left and right shutters; and the pair of joining members provided in the lower portion of the mounting port and the pair of upper joining members support the pair of left and right shutters in a manner of non-contact with other portions of the mounting port.

8. A method for opening and closing a mounting port via which an article is relayed between a worker and a conveying apparatus or a processing device in a clean room, the method comprising:

providing the mounting port including an article mounting stand, an apparatus-side opening that allows a conveying apparatus or a processing device to pass an article to and from the mounting stand, a passageway-side opening that faces a worker passageway, a pair of shutters provided at positions to open and close the apparatus-side opening and including arc-shaped plates or a plates bent in an arc; and a swing mechanism configured to swing the pair of shutters between a state in which the apparatus-side opening is opened and a state in which the apparatus-side opening is closed, the swing mechanism including a driving axis provided at a position symmetrical with respect to the pair of shutters, a pair of shutter axes, a link mechanism configured to swing the pair of shutter axes along a same angle in opposite directions by rotation of the driving axis, and a pair of joining members that are attached to the pair of shutters and the pair of shutter axes and swing the pair of shutters about the pair of shutter axes, and the pair of shutter axes are provided at positions that are separated from each other and symmetrical with respect to the driving axis; and swinging the pair of shutters about the pair of shutter axes to open and close the apparatus-side opening.

* * * * *